(12) United States Patent
Baur et al.

(10) Patent No.: US 8,791,548 B2
(45) Date of Patent: Jul. 29, 2014

(54) OPTOELECTRONIC SEMICONDUCTOR CHIP, OPTOELECTRONIC COMPONENT AND A METHOD FOR PRODUCING AN OPTOELECTRONIC COMPONENT

(75) Inventors: Elmar Baur, Regensburg (DE); Walter Wegleiter, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 838 days.

(21) Appl. No.: 12/678,363

(22) PCT Filed: Sep. 24, 2008

(86) PCT No.: PCT/DE2008/001579
§ 371 (c)(1),
(2), (4) Date: Jun. 28, 2010

(87) PCT Pub. No.: WO2009/039841
PCT Pub. Date: Apr. 2, 2009

(65) Prior Publication Data
US 2010/0276722 A1     Nov. 4, 2010

(30) Foreign Application Priority Data

Sep. 27, 2007 (DE) .......................... 10 2007 046 337

(51) Int. Cl.
*H01L 21/00* (2006.01)
*H01L 33/00* (2010.01)

(52) U.S. Cl.
USPC ........... 257/612; 257/448; 257/434; 257/443; 257/457; 257/459; 438/29; 438/25

(58) Field of Classification Search
USPC ........ 257/94, 103, 99, E33.07, 448, 434, 443, 257/457, 459
See application file for complete search history.

(56) References Cited

U.S. PATENT DOCUMENTS

| 5,698,865 | A | 12/1997 | Gerner et al. |
| 5,719,979 | A * | 2/1998 | Furuyama ........................ 385/89 |
| 6,743,702 | B2 | 6/2004 | Goto et al. |
| 7,009,218 | B2 | 3/2006 | Sugimoto et al. |
| 7,038,288 | B2 * | 5/2006 | Lai et al. ........................ 257/448 |

(Continued)

FOREIGN PATENT DOCUMENTS

| CN | 1523684 A | 8/2004 |
| DE | 195 17 697 A1 | 11/1996 |

(Continued)

*Primary Examiner* — Zandra Smith
*Assistant Examiner* — Tsz Chiu
(74) *Attorney, Agent, or Firm* — Slater & Matsil, L.L.P.

(57) ABSTRACT

A semiconductor chip is specified that has a contact layer that is not optimum for many common applications. For example, the contact layer is too thin to tolerate an operating current intended for the semiconductor chip without considerable degradation. Also specified is an optoelectronic component in which the semiconductor chip can be integrated so that the suboptimal quality of the contact layer is compensated for. In the component the semiconductor chip is applied to a carrier body so that the contact layer is arranged on a side of the semiconductor body that is remote from the carrier body. The semiconductor chip and the carrier body are at least partly covered with an electrically isolating layer, and an electrical conductor applied to the isolating layer extends laterally away from the semiconductor body and contacts at least a partial surface of the contact layer. In addition, an advantageous process for producing the component is specified.

19 Claims, 5 Drawing Sheets

(56) References Cited

U.S. PATENT DOCUMENTS

| | | |
|---|---|---|
| 7,323,724 B2 | 1/2008 | Sugimoto et al. |
| 7,345,313 B2 | 3/2008 | Strauss et al. |
| 2002/0146855 A1 | 10/2002 | Goto et al. |
| 2003/0080341 A1* | 5/2003 | Sakano et al. ............... 257/79 |
| 2004/0159836 A1 | 8/2004 | Sugimoto et al. |
| 2005/0072982 A1 | 4/2005 | Strauss et al. |
| 2005/0161771 A1* | 7/2005 | Suehiro et al. ............. 257/612 |
| 2006/0091417 A1 | 5/2006 | Sugimoto et al. |
| 2009/0065800 A1* | 3/2009 | Wirth et al. ................ 257/100 |
| 2009/0127573 A1 | 5/2009 | Guenther et al. |
| 2009/0180294 A1 | 7/2009 | Baur et al. |

FOREIGN PATENT DOCUMENTS

| | | |
|---|---|---|
| DE | 101 52 922 A1 | 5/2003 |
| DE | 103 39 985 A1 | 3/2005 |
| DE | 10 2004 050 371 A1 | 4/2006 |
| DE | 10 2006 015 117 A1 | 10/2007 |
| EP | 1 450 414 A2 | 8/2004 |
| EP | 1 803 163 A2 | 7/2007 |
| JP | 10-294493 A | 11/1998 |
| JP | 11-074560 A | 3/1999 |
| JP | 11-191642 A | 7/1999 |
| JP | 2000-223742 A | 8/2000 |
| KR | 1020070060140 A | 6/2007 |

* cited by examiner

OPTOELECTRONIC SEMICONDUCTOR CHIP, OPTOELECTRONIC COMPONENT AND A METHOD FOR PRODUCING AN OPTOELECTRONIC COMPONENT

This patent application is a national phase filing under section 371 of PCT/DE2008/001579, filed Sep. 24, 2008, which claims the priority of German patent application 10 2007 046 337.7, filed Sep. 27, 2007, each of which is incorporated herein by reference in its entirety.

TECHNICAL FIELD

This application relates to an optoelectronic semiconductor chip with a semiconductor body and an electrically conductive contact layer applied to the semiconductor body. In addition, the application relates to an optoelectronic component with such a semiconductor chip and a carrier body, and a method for producing an optoelectronic component.

BACKGROUND

Optoelectronic semiconductor chips of the kind mentioned above are known, for example, in the form of luminescence diode chips, in particular, in the form of light emitting diode chips. Usually, such chips have electrical contact layers in the form of metal contact electrodes, which often include a number of different metal layers stacked on top of each other. In the known semiconductor chips the thickness of such contact layers is chosen to be large enough that the contact layer will tolerate a sufficiently large electrical current, which corresponds at least to an intended operating current.

If the contact layer is too thin, the contact layer or an electrical contact between the contact layer and the semiconductor body may be destroyed or significantly adversely affected when the semiconductor chip is supplied with an operating current.

In optoelectronic components, contact layers are often electrically connected to the electrical conductors of the component by means of a bond wire.

SUMMARY

A semiconductor chip that, by comparison with conventional semiconductor chips, is technically simpler and can be produced at lower cost is disclosed. In addition, an optoelectronic component is specified in which the semiconductor chip can be integrated in a particularly advantageous way. An advantageous process for producing such an optoelectronic component is also to be specified.

An optoelectronic semiconductor chip of the kind mentioned above, in which the contact layer has a thickness of less than or equal to 1 µm, is specified. The thickness of the layer in connection with this application is understood to mean, in particular, a maximum thickness measured perpendicular to a main plane of extent of the layer.

In addition, or alternatively, the contact layer is designed so that it cannot be used as a bond pad for electrical connection by means of a bond wire.

Furthermore, in addition or alternatively, the contact layer is designed so that when it is supplied with an electrical operating current that is intended for the semiconductor chip the contact layer becomes significantly adversely affected. "Adversely affected" means that either the contact layer per se or an electrically conductive contact between the contact layer and the semiconductor body is changed when the chip is supplied with an intended operating current so that at least one performance parameter of the chip is significantly degraded. For example, the total resistance and/or the forward voltage of the semiconductor chip increases. For example, the contact layer is designed to be so thin that it at least partially melts when supplied with an operating current that is intended for the chip.

One embodiment of the semiconductor chip calls for the semiconductor chip to be intended for operation with a maximum current of greater than or equal to 1 A (direct current) and for the contact layer not to tolerate such a maximum current easily. The contact layer would not tolerate such an operating current, in particular, if it were electrically connected by means of a bond wire.

Furthermore, in addition or alternatively, the contact layer is applied on a main side of the semiconductor body, which has a two-dimensional extent of x mm² in a top view. Seen in top view, the contact layer has a two-dimensional extent of y mm². The thickness of the contact layer is less than or equal to $x/(y\cdot 4)$ µm, especially preferably less than or equal to $x/(y\cdot 3)$ µm, especially preferably less than or equal to $x/(y\cdot 2.5)$ µm or $x/(y\cdot 2)$ µm.

The semiconductor chip has a contact layer that is not optimum for many common applications. On the other hand, the semiconductor chip can be produced with the lowest cost because of the less costly designed contact layer. Due to this, the semiconductor chip can be produced especially particularly cheaply.

The contact layer, in particular, has metallic conductivity.

In one embodiment of the semiconductor chip, the thickness of the contact layer is less than or equal to 0.7 µm. Another embodiment of the optoelectronic semiconductor chip calls for the contact layer to have a thickness of less than or equal to 0.5 µm.

In a further embodiment of the semiconductor chip, the contact layer is supplied to a side of the semiconductor body on which electromagnetic radiation is coupled out from the semiconductor chip or is coupled into the semiconductor chip. In other words, the contact layer does not cover the entire free outer surface of the semiconductor body on this side.

In a further embodiment the contact layer is applied to a main side of the semiconductor body and covers an area of less than or equal to 30% of the total area, preferably less than or equal to 25% of the total area, and especially preferably less than or equal to 20% of the total area of the semiconductor body on this main side.

The semiconductor chip in one embodiment has an epitaxial semiconductor layer sequence with an active zone. In the operation of the semiconductor chip, electromagnetic radiation is created and/or received in the active zone.

The semiconductor chip is, in particular, a luminescence diode chip, which is suitable for emitting electromagnetic radiation in its operation. The contact layer is, in particular, arranged on a main emitting side of the luminescence diode chip.

In a further embodiment, in particular, the active zone of the semiconductor chip is based on a III/N compound semiconductor material, for instance a nitride compound semiconductor material like InAlGaN. In another embodiment the semiconductor layer sequence is based on a II/VI compound semiconductor material.

A III/V compound semiconductor material has at least one element from the third main group, for example, Al, Ga, In, and one element from the fifth main group, for example, B, N, P, As. In particular, the term "III/V compound semiconductor material" includes the group of the binary, ternary or quaternary compounds that contain at least one element from the third main group and at least one element from the fifth main group, for example, nitride and phosphide compound semiconductors. Such a binary, ternary or quaternary compound can moreover contain, for example, one or more dopants and additional constituents.

Correspondingly, a II/VI compound semiconductor material has at least one element from the second main group, for example, Be, Mg, Ca, Sr, and one element from the sixth main group, for example, O, S, Se. In particular, a II/VI compound semiconductor material includes a binary, ternary or quaternary compound that includes at least one element from the second main group and at least one element from the sixth main group. Moreover, such a binary, ternary or quaternary compound can contain, for example, one or more dopants and additional constituents. For example, the following compounds belong to the II/VI compound semiconductor materials: ZnO, ZnMgO, CdS, ZnCdS, MgBeO.

"Based on a nitride compound semiconductor material" means in this context that the semiconductor layer sequence or at least a part thereof, especially preferably at least the active zone and/or the growth substrate, contains a nitride compound semiconductor material, preferably $In_nAl_mGa_{1-n-m}N$ or consists thereof, where $0 \le n \le 1$, $0 \le m \le 1$, and $n+m \le 1$. This material does not necessarily have to have a mathematically precise composition in accordance with the above formula. Rather it can contain one or more dopants, for example, and additional constituents. For the sake of simplicity, however, the above formula implies only the important constituents of the crystal lattice (Al, Ga, In, N), even though these may be partially replaced and/or supplemented by small amounts of other substances.

An optoelectronic component is specified, in which the optoelectronic semiconductor chip is applied to a carrier body so that the contact layer is arranged on a side of the semiconductor body that is remote from the carrier body. The semiconductor chip and the carrier body are at least partially covered with an electrically isolating layer. An electrical conductor is applied to the isolating layer and extends laterally away from the semiconductor body. The electrical conductor, in particular, extends to a side of the isolating layer that is turned away from the carrier.

"Lateral" is understood to mean a direction that extends parallel to a main plane of extent of the semiconductor body or layers of the semiconductor body.

The electrical conductor contacts at least a part of an outer surface of the contact layer. By an outer surface of the contact layer essentially means that the outer surface of the contact layer is remote from the semiconductor body. The surface of the contact layer turned toward the semiconductor body does not belong thereto.

A part of the electrical conductor partly overlaps the semiconductor body and at least partly or completely overlaps the contact layer. Another part of the electrical conductor extends laterally away from the semiconductor body.

The electrical conductor can basically be designed and structured as desired, and in particular cases it can consist, in particular, of an unstructured electrically conductive layer. In an embodiment it is the electrical part of an electrical conductor path structure with several conductor paths, which can be both connected together and electrically isolated from each other.

In an embodiment of the component, the electrical conductor contacts at least 50% of an outer surface of the contact layer. Preferably the electrical conductor contacts at least 75%, especially preferably at least 90%, of the outer surface of the contact layer. The outer surface of the contact layer is an electrical terminal area of the semiconductor chip, i.e., it is suitable for electrical connection of the semiconductor chip.

In a further development of the component, the electrical conductor, in a region in which it contacts the contact layer, and the contact layer itself together have a total thickness of greater than or equal to 1.5 µm. Advantageously, this total thickness is greater than or equal to 2 µm. The contact layer is effectively made thicker by the part of the electrical conductor that contacts the contact layer. With that, the semiconductor chip in the component can be operated even at electrical currents at which a contact layer that is not made thicker would suffer damage.

In this case it is not the contact layer of the semiconductor chip that is provided with a sufficiently large thickness, but rather the electrical conductor of the component is applied to the contact layer so that it effectively makes the contact layer thicker and thus, when operated in the component, the contact layer does not suffer any damage even at high operating currents. Expressed in general terms, the semiconductor chip is integrated into the component so that any insufficient property of the contact layer becomes compensated.

In an embodiment of the optoelectronic component, it emits electromagnetic radiation created by the semiconductor chip in a main direction of radiation. The semiconductor chip has a first main surface, a first contact surface, and a second main surface with a second contact surface formed by the contact layer that lies opposite the first main surface.

In a further embodiment the carrier body has two terminal regions that are electrically isolated from each other, where the semiconductor chip with the first main surface is affixed to the carrier body and the first contact surface is electrically connected to the first terminal region by means of the electrical conductor. The isolating layer is, in particular, transparent. Then the radiation emitted in the main direction of radiation is coupled out through the isolation layer.

Alternatively, the contact layer of the semiconductor chip is electrically connected to an electrical terminal surface of another component by means of the electrical conductor. The additional component can be another semiconductor chip or a component with an appropriate housing and a semiconductor chip. In particular, it can also be a component that is of a different kind than the optoelectronic semiconductor chip. The additional component is, in particular, likewise applied to the carrier body and, in particular, can also be provided at least partly with the isolating layer.

"Of a different kind" means that the component differs in functional and/or structural characteristics from the optoelectronic semiconductor chip, where, in particular, it fulfills a different purpose, is based on different physical effects in its mode of activity, has differently formed electrical terminal surfaces or can be mounted in a different way.

The electrically isolating layer can advantageously fulfill several functions in the optoelectronic component. Since the isolating layer is electrically isolating, it prevents a short circuit from arising through the applied electrically conductive layer. This would be the case, for example, if a pn junction of the semiconductor chip were short-circuited by the application of the electrically conductive layer at the sides of the semiconductor chip or the two terminal regions of the carrier body were connected to each other by the electrical conductor. In addition, the isolating layer protects the semiconductor chip from environmental effects, especially dirt and moisture.

If the radiation emitted by the optoelectronic component in the main direction of radiation is coupled out through the isolating layer, the isolating layer can advantageously also contain a luminescence conversion material in order, for example, to create white light with a semiconductor chip that emits ultraviolet or blue radiation. Suitable luminescence conversion materials, for example, YAG:Ce ($Y_3Al_5O_{12}$:$Ce^{3+}$) are basically known to one skilled in the art. It is especially advantageous with respect to the efficiency of luminescence conversion if the isolating material abuts directly the surface of the semiconductor chip that is intended for radiation coupling.

The isolating layer is, for example, a plastic layer. Preferably, it is a silicone layer, since silicone is characterized by high resistance to radiation, especially UV light.

Especially preferably, the isolating layer has a glass layer or consists of a glass layer. An isolating layer with glass has the advantage that a glass has a thermal coefficient of expansion that conventionally is better matched to the semiconductor chip than is the case with a plastic. Due to this, temperature-related mechanical stresses, which might lead to cracks in the isolating layer or even to separation of the isolating layer, are advantageously reduced. Likewise, separation of the electrically conductive layer from the isolating layer caused by temperature stresses will be avoided. In addition, a glass is characterized by lower absorption of moisture than a plastic. In addition, the resistance to ultraviolet light is very high with an isolating layer made of glass.

The first main surface of the semiconductor chip can at the same time be the first contact surface, and the semiconductor chip can be affixed on this contact surface to the first terminal region of the carrier body. For example, the first contact surface of the semiconductor chip can be the back side of a substrate, which is preferably provided with a metallization, and the electrical connection to the first terminal region of the carrier body can take place with a solder connection or an electrically conductive adhesive.

Alternatively, however, it is also possible that both the first terminal layer and also the contact layer are situated on the second main surface of the semiconductor chip and both contact surfaces, with electrically conductive layers that are isolated from each other, are each connected to one of the two terminal regions of the carrier body. This is advantageous in the case of semiconductor chips that contain an isolating substrate, for example, a sapphire substrate. Isolating sapphire substrates are often used, for example, in the case of semiconductor chips based on nitride compound semiconductors.

The electrical conductor is, for example, a structured metal layer. This metal layer is preferably structured so that it covers only a small part of the second main surface of the semiconductor chip in order to avoid absorption of the radiation emitted by the optical electronic component in the metal layer. The structuring of the metal layer can, for example, take place by means of photolithography.

Especially preferably, the electrical conductor is a layer that is transparent for the emitted radiation. This is especially advantageous to reduce production costs, since the transparent layer does not have to be removed from the regions of the isolating layer that are intended for radiation coupling and thus no structuring is required. The electrical conductor can, for example, contain a transparent conductive oxide (TCO), in particular, indium-tin oxide (ITO).

Especially if a potential-free surface of the optoelectronic component is desired, in one embodiment of the component an isolating cover layer, for example, a varnish layer, is applied to the electrical conductor.

Specified is a method for producing an optoelectronic component in which a carrier body and the optoelectronic semiconductor chip are made available. The semiconductor chip is applied to the carrier body. An electrically isolating layer is applied to the semiconductor chip and the carrier body. Electrically conductive material is applied to the isolating layer so that it contacts the contact layer of the semiconductor chip and laterally extends away from the semiconductor chip, to form an electrical conductor.

In one embodiment of the invention, the electrical isolating layer is first applied so that it partly or completely covers the contact layer. Before application of the electrically conductive material, a recess is formed in the isolating layer to expose at least a part of the contact layer.

In an embodiment of the process, the recess in the isolating layer is made using laser ablation, i.e., the isolating layer is at least partially removed by means of laser radiation.

In an embodiment of the process, the isolating layer has a plastic layer. It can be applied, for example, by lamination of a plastic film, by printing or spraying a polymer solution.

In one variation of the process, a precursor layer is first applied to the semiconductor chip and the carrier body, for example, by a sol-gel process, by evaporation or by spin coating of a suspension. By means of a first heat treatment the organic components of the precursor layer are then removed. The resulting layer is then consolidated with a second heat treatment in order to create an isolating layer in the form of a glass layer.

The electrical conductor is advantageously at least partly applied by a PVD process, for example sputtering.

In a further embodiment a metal layer for the electrical conductor is applied and then reinforced by means of galvanic deposition.

Alternatively, the electrical conductor can also be applied with a printing process, especially a screen printing process. In addition, the electrical conductor can also be created with a spray-on or spin coating process.

BRIEF DESCRIPTION OF THE DRAWINGS

Other advantages, embodiments and developments of the semiconductor chip, the component and the process follow from the embodiment examples that are explained below in connection with the figures. Here.

In the embodiment examples and figures, parts that are the same or that function the same are each provided with the same reference numbers. The represented parts and the size relationships of the parts with respect to each other are not to be seen as true to scale. Rather some details of the figures are exaggerated for better understanding.

DETAILED DESCRIPTION OF ILLUSTRATIVE EMBODIMENTS

In an exemplary process for producing a semiconductor chip, a semiconductor wafer 100, which has an epitaxial semiconductor layer sequence with an active zone for creation of electromagnetic radiation is provided. The semiconductor layer sequence is based, for example, on a nitride compound semiconductor and emits, for example, UV radiation and/or blue light.

Figure 1A:
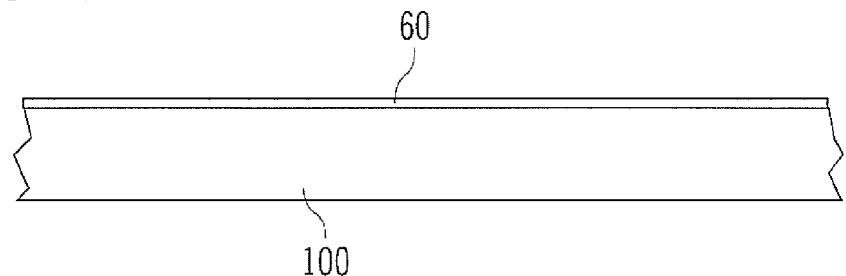
FIGS. 1A-1C show schematic sectional views of a section of a wafer with semiconductor bodies for a plurality of semiconductor chips during various process steps of an exemplary process for producing the semiconductor chips.

A material 60 for a plurality of contact layers is applied to semiconductor wafer 100 in a thin layer; see FIG. 1A. Material 60 is applied in a thickness of less than 0.5 μm, for example, with a maximum thickness of 0.35 μm, 0.25 μm or 0.2 μm. For example, here it is a single metal layer or a metal layer sequence with at least two different metal layers. Suitable materials and structures for a metal layer that is suitable for formation of a contact layer for a semiconductor body are well known to one skilled in the art.

Figure 1B:
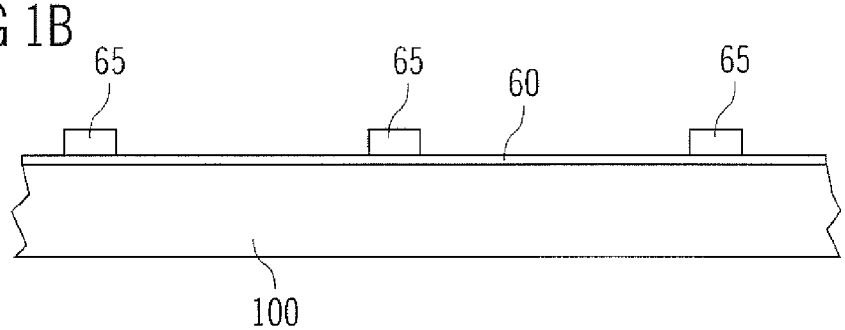

Then a photoresist 65 is applied over the entire surface of material 60 and photolithographically structured; see FIG. 1B. The photoresist 65 is structured so that it only remains in the regions in which contact layers are intended and it is removed in the remaining regions.

In additional process steps, material 60 is removed in the regions in which it is free of the photoresist, for example, by etching. Then the photoresist is removed, so that a number of separated contact layers 6 remain on wafer 100; see FIG. 1C.

It may be necessary in the process to form an electrically conductive contact between wafer 100 and material 60 or contact layers 6, which involves, for example, a delivery of energy. For example, at least a heat treatment of the contact layer and the wafer can be carried out.

Figure 1C:
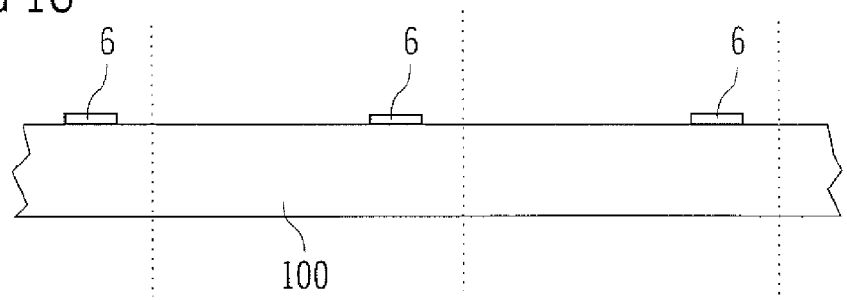
Figure 2:
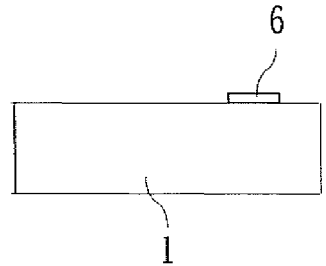
FIG. 2 shows a schematic sectional view of an embodiment example of the semiconductor chips.

The method additionally includes a singulation of the semiconductor chip from the wafer bond. The singulation can take place along singulation lines, which are illustrated in FIG. 1C in the form of broken lines. FIG. 2 shows a semiconductor chip singulated from the wafer.

The semiconductor chip has, for example, in a top view onto the main side on which the contact layer 6 is arranged, a recess of 1 mm$^2$. It is intended, for example, to be operated with a maximum operating current of at least 1 A (direct current). Generally, the semiconductor chip in top view has a two-dimensional extent of x mm$^2$ and is intended to be operated with a maximum operating current of x A (direct current). In addition or alternatively the semiconductor chip is intended to be operated, for an extent of x mm$^2$, at a maximum operating current from a range of at least 2·x A up to at least 5·x A (pulsed current in each case).

However, the contact layer 6 is designed so that operation with such current is not possible if the contact layer is electrically connected by means of a bond wire, without the performance of the semiconductor chip being significantly reduced. A reduction of performance can, for example, entail an increase of the forward voltage of the semiconductor chip, a degradation of the contact layer and/or degradation of electrical contact between the contact layer and the semiconductor body.

The contact layer has, for example, in a top view on the main side of the semiconductor body, a two-dimensional recess, which is 0.2 times the extent of the overall main side in the top view. The thickness of the contact layer is, for example, 0.25 μm or 0.3 μm. The larger the degree of coverage of the main side by the contact layer is, the smaller the thickness, for example, can be.

As an alternative to the embodiment example shown in FIG. 2, the semiconductor body can also have two contact layers on the same main side. It is also possible that the contact layer covers more than 50% of the main side. In addition, it is also possible that the contact layer comprises or essentially consists of a transparent conductive oxide (TCO).

Figure 3:
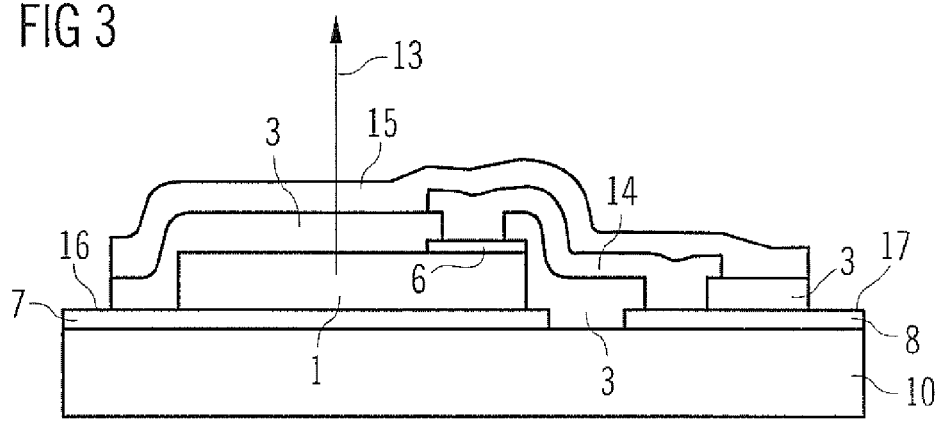
FIG. 3 shows a schematic sectional view of a first embodiment example of the optoelectronic component.

The first embodiment example of the optoelectronic component, which is shown in FIG. 3, contains a carrier body 10, on which two contact metallizations are applied, which form a first terminal region 7 and a second terminal region 8. A semiconductor chip 1 is mechanically and electrically mounted on the first terminal region 7 with a first main side 2, which has a first electrical contact surface 4. The mounting of the semiconductor chip 1 on the first terminal region 7 takes place by soldering or gluing, for example. On a second main side 5 of the semiconductor chip 1, which lies over the first main side 2, the semiconductor chip 1 has an electrical contact layer 6, which forms a contact layer.

The semiconductor chip 1 and the carrier body 10 are provided with an insulating layer 3 in the form of an insulating layer. The insulating layer 3 is, for example, a plastic layer. In particular, it can be a silicone layer, since a silicone layer is characterized by a particularly good resistance to radiation. Especially preferably, the isolating layer 3 is a glass layer.

The contact layer 6 and the second terminal region 8 are connected together by an electrical conductor 14 in the form of an electrically conductive layer, which is brought over a partial region of the isolating layer 3. The electrical conductor 14 contains, for example, a metal or an electrically conductive transparent oxide (TCO), for example, indium-tin oxide (ITO), ZnO:Al or SnO:Sb. The electrical conductor contacts, for example, 80% of the outer surface of the contact layer.

To obtain a potential-free surface, an isolating cover layer 15, for example, a varnish layer, is applied to the electrical conductor 14. In the case of a transparent isolating cover layer 15, it advantageously does not have to be structured and therefore can be applied over the entire surface of the optoelectronic component. The isolating layer 3 and cover layer 15 can, for example, be removed from partial regions 16 and 17 of the terminal surfaces 7 and 8, so that electrical connections for supplying power to the optoelectronic component can be made in these exposed partial regions 16 and 17.

The semiconductor chip 1 is protected from environmental effects, especially dirt or moisture, by the isolating layer 3. The isolating layer 3 additionally functions as an isolating carrier for electrical conductors 14, which prevents short-circuiting of the sides of the semiconductor chip 1 and/or the two terminal surfaces 7 or 8 of the carrier body.

In addition, the radiation emitted by the semiconductor chip 1 in a main direction of radiation 13 is coupled out from the optoelectronic component through the isolating layer 3. This has the advantage that it is possible to add to the isolating layer 3 a luminescence conversion material, with which the wavelength of at least a part of the emitted radiation can be shifted to longer wavelengths. In particular, white light can be created in this way by converting the radiation created by a semiconductor chip 1 that emits in the blue or ultraviolet spectral range to the complementary yellow spectral range. Preferably, a semiconductor chip with a radiation-generating active zone that contains a nitride compound semiconductor material such as GaN, AlGaN, InGaN or InGaAlN is used for this.

An embodiment example of the process is explained in more detail in the following in FIGS. 4A to 4H.

Figure 4A:
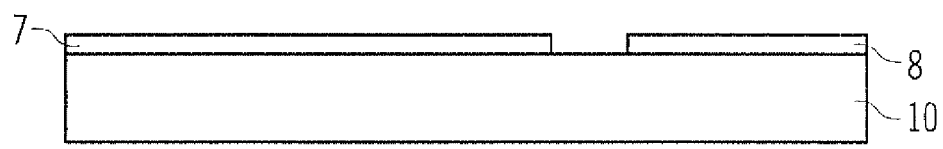
FIGS. 4A-4H show schematic sectional views of the component represented in FIG. 3 during various process steps of an embodiment example of the process.

FIG. 4A shows a carrier body 10, on which two terminal regions 7 and 8 that are electrically isolated from each other are formed, for example, by application and structuring of a metallization layer.

Figure 4B:
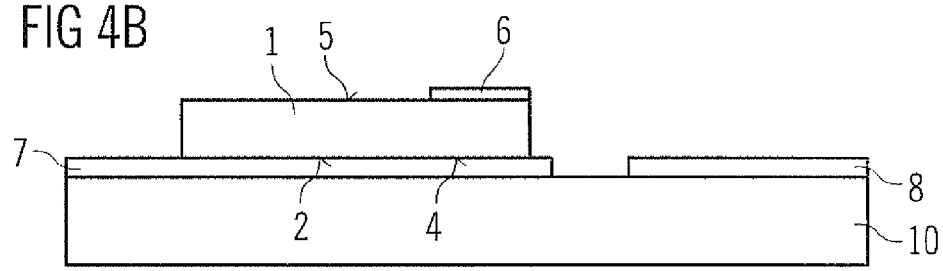

In the steps shown in FIG. 4B, a semiconductor chip 1, which has a first main surface 2 and a second main surface 5, with a first contact surface 4, which in this embodiment example is the same as the second main surface 2 of the semiconductor chip 1, is mounted on the first terminal region 7 of the carrier body 10. The mounting of the semiconductor chip 1 on the carrier body 10 takes place, for example, by means of a solder joint or an electrically conductive adhesive. On the second main surface 5 the semiconductor chip 1 has a contact layer 6, which is applied to the second main surface 5 and forms a contact surface. The contact layer 6 was, for example, structured by photolithography.

Figure 4C:
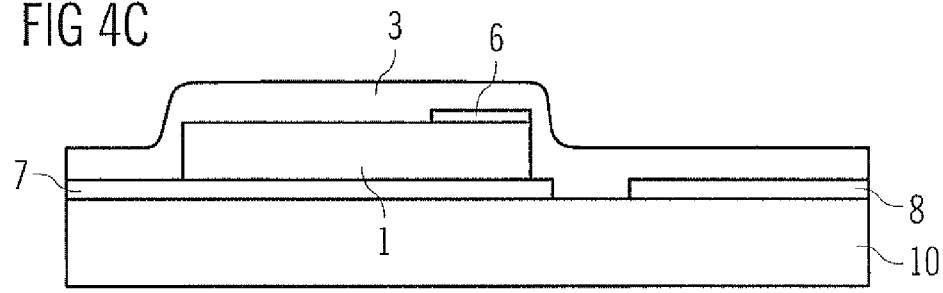

FIG. 4C shows an intermediate step in which an isolating layer 3 is applied to the semiconductor chip 1 and the carrier body 10 that is provided with the terminal regions 7 and 8. The application of the isolating layer 3 takes place preferably by spraying or spin coating of a polymer solution. In addition, a printing process, in particular screen printing, is advantageous for application of the isolating layer 3.

Figure 4D:
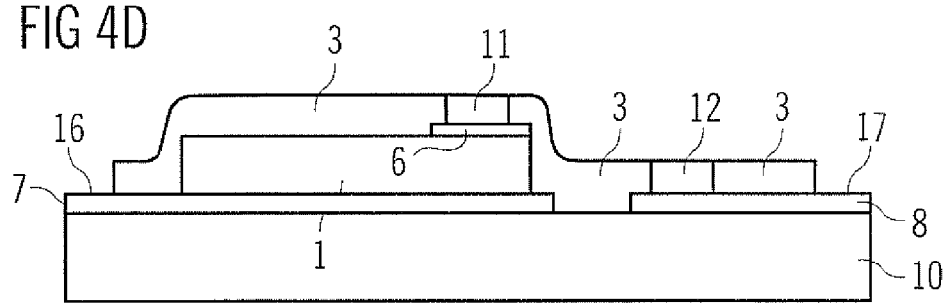

In the process step shown in FIG. 4D, a first recess 11, through which a partial region of the second contact surface formed by the contact layer 6 is exposed, and a second recess 12, through which a partial region of the second terminal region 8 of the carrier body 10 is exposed, are created in the isolating layer 3. The recesses 11 and 12 are preferably created by laser treatment, for example, laser ablation. For example, a partial region 16 of the first terminal region 7 and a partial region 17 of the second terminal region 8 are also exposed in order to enable electrical connections to the carrier body 10 of the optoelectronic component.

Figure 4E:
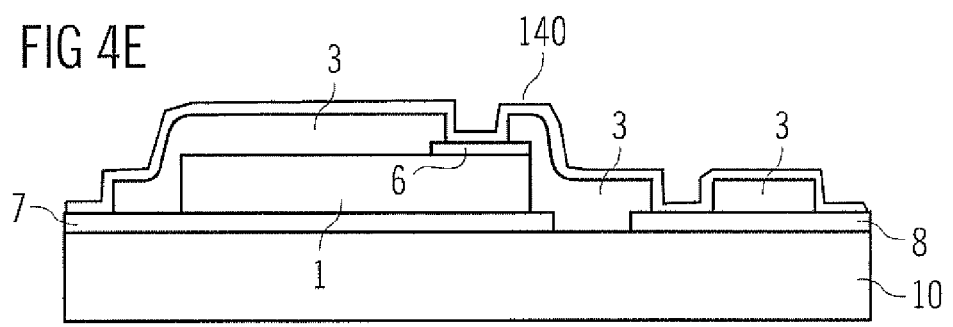
Figure 4F:
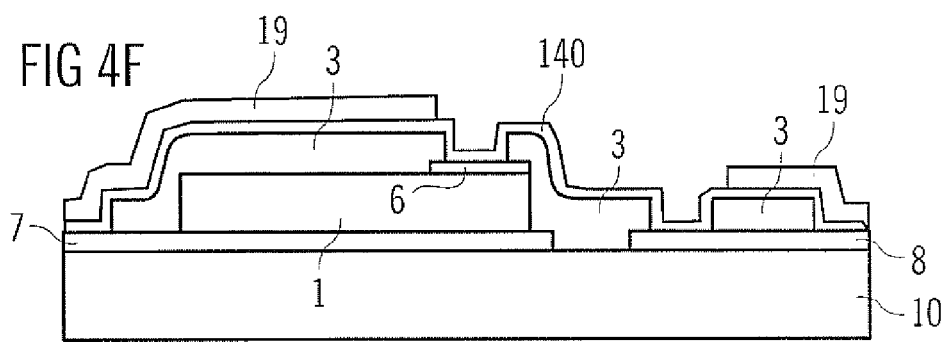
Figure 4G:
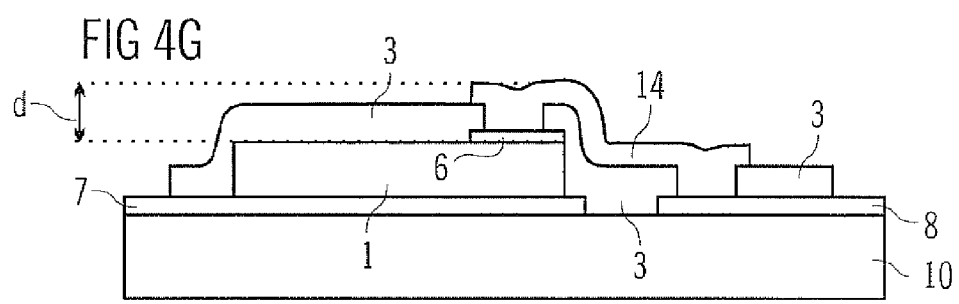

In the process steps illustrated in FIGS. 4E to 4G, the contact layer 6 previously exposed through recess 11 is electrically connected by an electrical conductor 14 with the region of the second terminal region 8 that was previously exposed through recess 12.

The electrical conductor 14 is a metal layer, for example. It can be created, for example, by first applying a comparably thin metal layer 140, which has a thickness of, for example, 200 nm, or about 100 nm, over the entire surface of the isolating layer 3. This can take place, for example, by evaporation or sputtering. A process step for application of such a thin metal layer 140 is illustrated in FIG. 4E.

Then a part of the thin metal layer 140 is covered by a temporary isolation layer 19; see FIG. 4F. For example, an isolation layer 19 is applied in the form of a photoresist layer onto the metal layer 140. A recess is created in the photoresist layer by phototechnology in the region in which the electrical conductor 14 is supposed to connect the contact layer 6 with the second terminal region 8. The part of the thin metal layer 140 that is not covered is intended to be made thicker subsequently.

In the region of the recess in the photoresist layer, the previously uncovered metal layer is reinforced, for example, by galvanic deposition. This advantageously takes place by the metal layer being considerably thicker in the galvanically reinforced region than the metal layer previously applied over the entire surface. For example, the thickness of the metal layer in the galvanically reinforced region can amount to several μm.

Then the photoresist layer is removed, and an etching process is carried out, with which the metal layer is completely removed in the region that was not galvanically reinforced. In the galvanically reinforced region, the metal layer, because of its greater thickness, is only partly removed, so that in this region it remains as an electrical conductor 14; see FIG. 4G.

In a region in which the electrical conductor 14 contacts the contact layer 6, the electrical conductor 14 and the contact layer 6 together make up a total thickness d of, for example, at least 1.7 μm, 2.1 μm or 2.5 μm; see FIG. 4G. A clearly greater total thickness of, for example, at least 3 μm, at least 4 μm or even at least 5 μm is also possible.

As an alternative to the formation of the electrical conductor 14 using galvanic reinforcement of a thin metal layer, it is basically also possible to apply the electrical conductor directly in structured form onto the isolating layer 3. This can take place, for example, with a printing process, especially a screen printing process. In this way, however, lesser thicknesses of the electrical conductor 14 can usually be realized than when it is galvanically reinforced.

A structuring or structured application of the electrically conductive layer 14 may not be necessary if an electrically conductive layer 14 that is transparent for the emitted radiation is applied. In particular, a transparent conductive oxide (TCO), preferably indium-tin oxide (ITO), is suitable as the electrically conductive transparent layer, or alternatively an electrically conductive plastic layer is suitable. The electrically conductive transparent layer is preferably applied by evaporation, printing, spraying or spin coating.

Figure 4H:
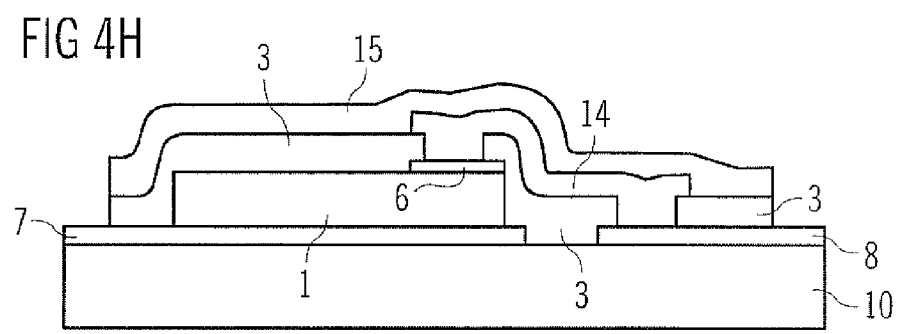

In the process step illustrated in FIG. 4H, an electrically isolating cover layer 15 is applied. The isolating cover layer 15 is preferably a plastic layer, for example, a varnish layer. The isolating cover layer 15 covers, in particular, the electrical conductor 14 in order to create a potential-free surface.

An alternative variation of the application of the isolating layer 3, thus the intermediate step shown earlier in FIG. 4C, is explained below by means of FIGS. 5A, 5B and 5C.

First a precursor layer 9, which contains both organic and inorganic components, is applied to the semiconductor chip 1 and carrier body 10.

The application of the precursor layer 9 takes place, for example, by a sol-gel process, evaporation, sputtering, spraying or spin coating of a suspension.

Figure 5A:
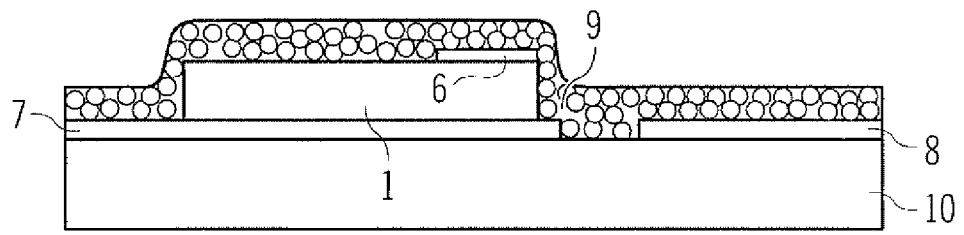
FIGS. 5A-5C show schematic sectional views of the component represented in FIG. 3 during various process steps of another embodiment example of the process.
Figure 5B:
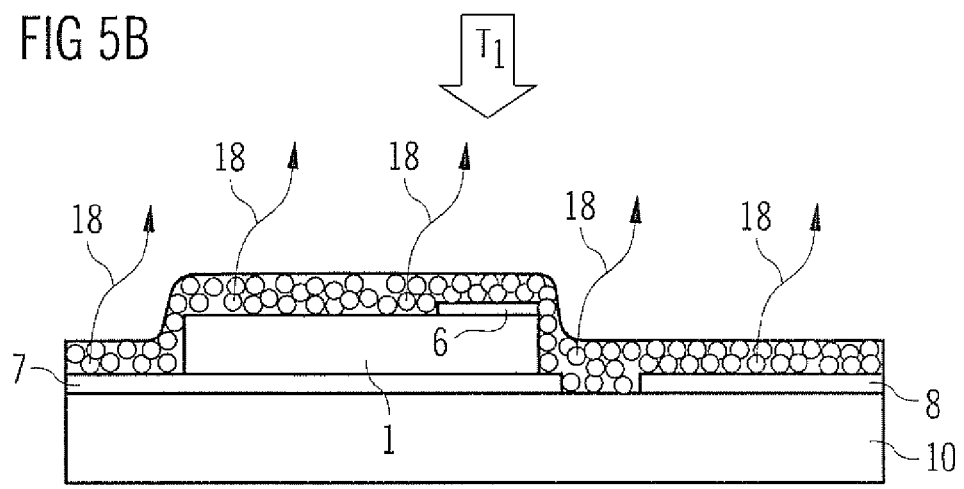

The organic components are removed from the precursor layer 9, as indicated by the arrows 18 in FIG. 5B, by a heat treatment at a temperature $T_1$ of preferably about 200° C. to 400° C. for about 4 h to 8 h in a neutral $N_2$ atmosphere or under slight $O_2$ partial pressure.

Figure 5C:
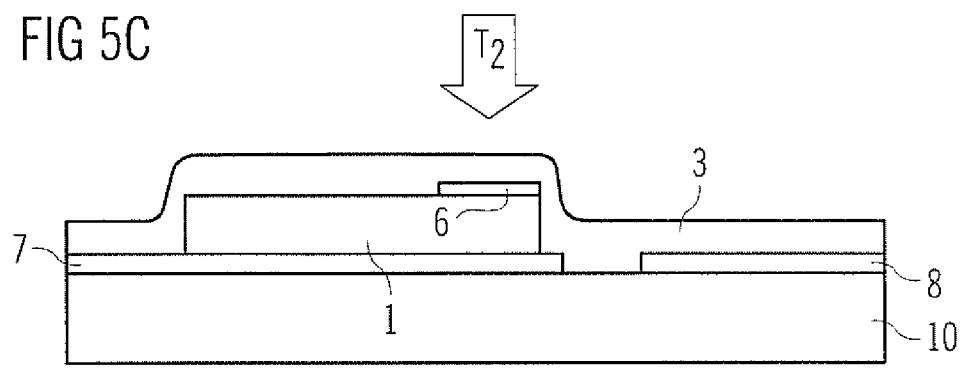

The resulting layer is then consolidated with a sintering process as shown schematically in FIG. 5C in order to create the isolating layer 3. The sintering takes place by an additional heat treatment at a temperature $T_2$ of preferably about 300° C. to 500° C. for about 4 h to 8 h. Depending on the type of glass layer, the sintering is preferably carried out in a reducing or oxidizing atmosphere.

The process steps described in FIGS. 5A, 5B and 5C are also used in an analogous manner for production of a cover layer 15, which has a glass or consists of a glass. In this case these process steps are preferably carried out a first time to create a glass layer for the isolating layer 3 and repeated after application of the electrically conductive layer 14 in order to deposit a glass layer for the cover layer 15.

By several repetitions of the application of an electrically isolating layer and an electrically conductive layer, it is also possible to implement multilayer circuits. This is particularly advantageous for LED modules that contain a plurality of semiconductor chips or other components of a different kind in addition to at least one semiconductor chip.

The invention is not limited by the description using the embodiment examples. Rather the invention includes each new characteristic and each combination of characteristics, which, in particular, implies any combination of characteristics in the claims, even if the characteristic or combination itself is not explicitly specified in the claims or embodiment examples.

The invention claimed is:

1. An optoelectronic component comprising:
   an optoelectronic semiconductor chip comprising a semiconductor body and a metallic, electrically conductive contact layer overlying the semiconductor body, wherein the contact layer has a thickness of less than or equal to 1 μm;

a carrier body, wherein the semiconductor chip is disposed on the carrier body so that the contact layer is arranged on a side of the semiconductor body that is remote from the carrier body;

an electrically isolating layer, wherein the semiconductor chip and the carrier body are covered at least partly with the electrically isolating layer, wherein the electrically isolating layer has a recess over the metallic, electrically conductive contact layer; and an electrical conductor over the isolating layer, wherein the electrical conductor contacts at least a part of an outer surface of the contact layer and extends laterally away from the semiconductor body, wherein the electrical conductor, as seen from the carrier, is over the electrically isolating layer, a part of the electrical conductor being applied through the recess so that the electrical conductor electrically connects to the metallic, electrically conductive contact layer of the semiconductor body.

2. The optoelectronic component as in claim 1, wherein the electrical conductor contacts at least 50% of the outer surface of the contact layer.

3. The optoelectronic component as in claim 1, wherein a region of the electrical conductor that contacts the contact layer and the contact layer beneath this region together have a total thickness of greater than or equal to 1.5 µm.

4. The optoelectronic component as in claim 3, wherein a total thickness is greater than or equal to 2 µm.

5. The optoelectronic component as in claim 1, wherein the isolating layer comprises at least one material from the group consisting of plastic, silicone and glass.

6. The optoelectronic component as in claim 1, wherein an electrically isolating cover layer is applied to a conductor path structure.

7. A process for producing an optoelectronic component, the process comprising:

providing a carrier body and an optoelectronic semiconductor chip comprising a semiconductor body and a metallic, electrically conductive contact layer overlying the semiconductor body, applying the semiconductor chip to the carrier body, applying an electrically isolating layer to the semiconductor chip and the carrier body, wherein the electrically isolating layer has a recess over the metallic, electrically conductive contact layer, and applying electrically conductive material to the isolating layer so that it contacts a contact layer of the semiconductor chip and extends laterally away from the semiconductor chip to form an electrical conductor, wherein a part of the electrical conductor is applied through the recess so that the electrical conductor electrically connects to the metallic, electrically conductive contact layer of the semiconductor body.

8. A process for producing an optoelectronic component, comprising:

providing a carrier body and an optoelectronic semiconductor chip, applying the semiconductor chip to the carrier body, applying an electrically isolating layer to the semiconductor chip and the carrier body, applying electrically conductive material to the isolating layer so that it contacts a contact layer of the semiconductor chip and extends laterally away from the semiconductor chip to form an electrical conductor, wherein the application of electrically conductive material comprises an application of a metal layer and a reinforcement of the metal layer by means of galvanic deposition.

9. The process as in claim 7, wherein the application of the isolating layer comprises an application of a premade layer or a printing, spraying or spin coating of a material for the isolating layer.

10. The process as in claim 8, wherein before the application of the electrically conductive material a recess is made in the isolating layer in order to expose at least a part of the contact layer.

11. The process as in claim 8, wherein the application of the metal layer comprises the use of a PVD process.

12. The process as in claim 7, wherein the contact layer has a thickness of less than or equal to 0.7 µm.

13. The process as in claim 7, wherein the contact layer has a thickness of less than or equal to 0.5 µm.

14. The optoelectronic component as in claim 1, wherein the contact layer is applied on a main side of the semiconductor body and covers an area of less than or equal to 25% of a total area of the main side.

15. The process as in claim 7, wherein the contact layer has a thickness of less than or equal to 1 µm.

16. The optoelectronic component as in claim 1, wherein the contact layer has a thickness of less than or equal to 0.7 µm.

17. The optoelectronic component as in claim 1, wherein the contact layer has a thickness of less than or equal to 0.5 µm.

18. The optoelectronic component as in claim 1, wherein the electrical conductor connects the metallic, electrically conductive contact layer of the semiconductor body to a terminal region formed by a metallization layer on the carrier, wherein the terminal region is situated on the same side of the carrier as the semiconductor chip.

19. The optoelectronic component as in claim 18 wherein the electrically isolating layer has a recess over the terminal region, in which a part of the electrical conductor is applied and through which the electrical conductor electrically contacts the terminal region.

* * * * *